United States Patent
Hamazawa

(12)
(10) Patent No.: US 6,914,298 B1
(45) Date of Patent: Jul. 5, 2005

(54) DOUBLE DIFFUSION MOSFET WITH N+ AND P+ TYPE REGIONS AT AN EQUAL POTENTIAL

(75) Inventor: Yasushi Hamazawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/346,806

(22) Filed: Jan. 17, 2003

(30) Foreign Application Priority Data

Jan. 18, 2002 (JP) ........................................ 2002-010127

(51) Int. Cl.[7] ................ H01L 29/76; H01L 29/94; H01L 23/58
(52) U.S. Cl. ............... 257/343; 257/409; 257/492; 257/493
(58) Field of Search ................... 257/343, 355, 257/409, 492, 493

(56) References Cited

U.S. PATENT DOCUMENTS 5,155,562 A * 10/1992 Tsuchiya ............... 257/343

5,168,333 A 12/1992 Nakagawa et al.

FOREIGN PATENT DOCUMENTS

EP 0 361 589 4/1990
EP 1 130 652 A1 9/2001

* cited by examiner

*Primary Examiner*—Steven Loke
(74) *Attorney, Agent, or Firm*—Merchant & Gould P.C.

(57) ABSTRACT

A double diffusion MOSFET is disclosed which comprises: a drain region 13 of an N-type semiconductor layer formed on a semiconductor substrate 11; a body region 15 of a P-type semiconductor region formed in the drain region 13; an N-type source region 16 formed in the body region 15; and a gate electrode 21 formed on a surface of the body region 15, wherein the drain region 13 contains N+ type drain contact regions 18 and P+ type regions 19 such that those are put at an equal potential.

10 Claims, 8 Drawing Sheets

DOUBLE DIFFUSION MOSFET WITH N+ AND P+ TYPE REGIONS AT AN EQUAL POTENTIAL

BACKGROUND OF THE INVENTION

1. Field of the Invention

The present invention relates to a lateral double diffusion MOSFET and a semiconductor device using the same, and more particularly to a lateral double diffusion MOSFET having a high Electro-static discharge performance (ESD) and low on-resistance.

2. Description of the Related Art

Lateral double diffusion MOSFETs, called L-DMOSs, are known for the FETs of ICs and discrete devices, which are generally used in a relatively low voltage region of 100V or lower. The lateral double diffusion MOSFET may be formed by normal diffusion process, and unlike the vertical double diffusion MOSFET, allows all the terminals to be drawn out from the chip top surface. Therefore, it is fit for use in IC fabrication, and is widely used where low on-resistance is required. FIG. 5 is a cross sectional view perspectively showing a conventional lateral double diffusion MOSFET. In the lateral double diffusion MOSFET (referred to as an L-DMOSFET), a drain region 103 is formed by epitaxially growing an N-type semiconductor layer on a P-type semiconductor substrate 101 with an $N^+$ type buried region 102 being interposed therebetween. An N-type impurity is diffused into the drain region 103 to thereby form an $N^+$ type drain contact region 104, and a P-type impurity is diffused into the drain region to thereby form a body region 105. An $N^+$-type source region 106 is formed in a surface region of the body region 105, while being spaced apart from an outer edge of the body region 105. A $P^+$-type region 107 is formed on the inner side of the N+-type source region 106. A drift channel region is formed between the N+-type source region 106 and the N+ type drain contact region 104. A gate electrode is provided covering a surface region ranging from an outer edge part of the N+-type source region 106 to the inner edge part of the drift channel region, while a gate oxide film is interposed therebetween.

This kind of L-DMOSFET is low in on-resistance (operating resistance), although its withstand voltage is high, when comparing with a normal MOSFET. The L-DMOSFET is frequently used in a broad voltage range from several V to 100V, and in particular in power source ICs and motor drivers, it is widely used.

The L-DMOSFET, as shown in FIG. 6, is inevitably accompanied by a parasitic NPN transistor (having an NPN structure including a drain region 103, a body region 105 and the N+-type source region 106), however. This parasitic NPN transistor frequently binders various normal operations of the L-DMOSFET.

When the L-DMOSFET is used in an open drain state, static electricity is applied to the output terminal (drain), the static electricity is trapped, and its entire current flows within the L-DMOSFET. At this time, the parasitic NPN transistor operates as in a positive feedback mode with respect to temperature. As a result, current concentrates at a weak part of the transistor, which was formed during its manufacturing process. And the device will easily be broken.

To improve the breakdown strength, attempt is made to reduce a gain of the parasitic NPN transistor or to additionally use a protection circuit. However, if the gain of the parasitic NPN transistor is reduced, the characteristic of the L-DMOSFET is degraded. If the protection circuit is additionally used, a chip area is increased.

An insulated gate bipolar transistor (IGBT) is well known for a semiconductor element having an extremely high resistance to the static electricity. As shown in FIG. 7, the IGBT has a structure in which the N+ type drain contact region 104 of the L-DMOSFET shown in FIG. 5 is substituted by a $P^+$-type drain contact region 110.

As shown in FIG. 8, the IGBT is attendant with a parasitic thyristor (an NPN transistor formed with a drain region 103, a body region 105 and an N+-type source region 106, and a PNP transistor formed with the body region 105, a drain region 103 and the P+-type drain contact region 110). When an excessive current as by the static electricity flows through the IGBT, the parasitic thyristor is turned on, and the IGBT can process large current with extremely low operating resistance value. Accordingly, the IGBT has an extremely high Electro-static discharge performance (ESD).

In the IGBT, a conductivity of the drain region 103 is varied to reduce a resistance component by positive holes that are injected into the drain region 103 from the P+-type drain contact region 110, which is formed by diffusing a P-type impurity into the drain region (collector) 103. Accordingly, the IGBT is frequently used as a high voltage withstanding element of 100V or higher and having a relatively long drift length (d). The IGBT is a punch-through device. Accordingly, it is impossible to set the drift length to be too long. Accordingly, it is rare that the IGBT is used in a relatively low voltage region of 100V or lower. There is no advantage to integrating an IGBT into an IC rather than an L-DMOSFET. Therefore, the use of an IGBT in such a case is increasingly rare.

A loss of the Vf (forward voltage) value of the IGBT is large at an initial stage of its start. Therefore, in a low current region, the on-resistance of the IGBT is higher than that of the L-DMOSFET, and the IGBT has many disadvantages. Further, in a large current region, the latch-up of the parasitic thyristor is easy to occur. Accordingly, care must be taken for use conditions. Further, minority carriers take part in the operation of the IGBT. Accordingly, the frequency characteristic of the IGBT is inferior to that of the L-DMOSFET. This also is recognized as a large defect of the IGBT.

As described above, the conventional L-DMOSFET is advantageous in that it is easy to attain a high voltage standing performance and is low in on-resistance, but is disadvantageous in that the Electro-static discharge performance (ESD) is low. The IGBT is advantageous in that its Electro-static discharge performance (ESD) is extremely high, but has many disadvantages: For example, it is not suitable for high integration; the on-resistance is high in a low current region; and the frequency characteristic is bad.

SUMMARY OF THE INVENTION

Accordingly, an object of the invention is to provide an L-DMOSFET which has a high dielectric breakdown resistance quantity without any degradation of the characteristics proper to the L-DMOSFET and any increase of the element area, and a semiconductor device using the same.

To achieve the above object, there is provided a double diffusion MOSFET comprising: a drain region of an N-type semiconductor layer formed on a semiconductor substrate; a body region of a P-type semiconductor region formed in the drain region; an N-type source region formed in the body region; and a gate electrode formed on a surface of the body region with a gate insulating film being interposed therebetween, wherein the drain region contains N+ type drain contact regions formed on a surface of the drain region and P+ type regions electrically connected to the N+ type drain contact regions so that the N+ type drain contact regions and the P+ type regions are put at an equal potential.

With such a construction, the N+ type drain contact regions and the P+ type regions are formed in the drain region, while being at an equal potential, whereby a PNP transistor is parasitic to the L-DMOSFET. This parasitic PNP transistor and the originally present NPN transistor cooperatively form a parasitic thyristor.

In the construction, the N+ type drain contact regions and the P+ type regions are put at an equal potential. Accordingly, in a normal operation of the L-DMOSFET, the parasitic thyristor may be prohibited from being turned on.

Accordingly, in the L-DMOSFET, there is no need for reducing the gain of the parasitic NPN transistor, and hence the L-DMOSFET is free from the problem of degrading its original characteristic. Further, there is no need of providing the protection circuit or the like for the improvement of the breakdown resistance quantity. Accordingly, a high dielectric breakdown resistance quantity is obtained without increasing the element area.

In the L-DMOSFET of the invention, the drain region formed so as to come in contact with the N+ type drain contact regions and extending to a surface of the P+ type regions. The N+ type drain contact regions and the P+ type regions are in electrical contact with one another.

With such a structure, the N+ type drain contact regions are brought into electrical contact with the P+ type regions by the drain electrode. Therefore, those regions may easily be put at the equal potential by only the drawing of the electrode.

Preferably, the N+ type drain contact regions are shaped like a comb, and the P+ type regions are each placed in gaps, with each gap being between the adjacent projections thereof.

The N+ type drain contact region is cut out at plural positions, equidistantly spaced, along the N-type source region. The P+ type regions are provided at each of those cutout parts.

Preferably, the N+ type drain contact regions are shaped like a comb of which the projections are located on the gate side, and the P+ type regions are each placed in gaps, with each gap being between the adjacent projections thereof.

With this structure, the P+ type regions are provided within the N+ type drain contact regions, whereby a parasitic thyristor may easily be formed.

An end of the P+ type region closer to the body region is preferably separated (set back) further apart from the body region than an end of the N+ type drain contact region closer to the region.

With this structure, a sufficient punch through breakdown voltage is secured with the drift length equal to that of the conventional L-DMOSFET. Accordingly, the L-DMOSFET of the invention is capable of greatly improving the Electro-static discharge performance (ESD) without any increase of the element area, while retaining the characteristics of the conventional L-DMOSFET.

The P+ type regions are formed in an area surrounded by the N+ type drain contact regions.

This structure easily forms a parasitic thyristor. An end of the P+ type region closer to the body region is preferably separated (set back) further apart from the body region than an end of the N+ type drain contact region closer to the region. With this structure, a sufficient punch through breakdown voltage is secured with the drift length equal to that of the conventional L-DMOSFET. Accordingly, the L-DMOSFET of the invention is capable of greatly improving the Electro-static discharge performance (ESD) without any increase of the element area, while retaining the characteristics of the conventional L-DMOSFET.

The P+ type regions and the N+ type drain contact regions are preferably formed in an N buffer layer formed in the drain-region.

This feature further improves the punch through breakdown voltage and further reduces the on-resistance.

A semiconductor device of the invention is formed by integrating the L-DMOSFET of the invention together with another element.

Specifically, a semiconductor device comprises: a semiconductor substrate; a drain region of an N-type semiconductor region formed on a surface of the semiconductor substrate; a body region of a P-type semiconductor region formed in the drain region; an N-type source region formed in the body region; a gate electrode formed on a surface of the body region with a gate insulating film being interposed therebetween; N+ type drain contact regions formed on a surface of the drain region and P+ type regions electrically connected to the N+ type drain contact regions so that the N+ type drain contact regions and the P+ type regions are put at an equal potential, the N+ type drain contact regions and the P+ type regions being located within the drain region; a drain electrode extending from the N+ type drain contact regions to a surface of the P-type region; and a source electrode formed so as to come in contact with the N-type source region.

Preferably, the source electrode is formed extending to a surface of the P+ type body region.

In the thus arranged semiconductor device, the breakdown withstand voltage of the L-DMOSFET may easily be adjusted by varying the drift length of the L-DMOSFET to be integrated together with the element and the setback length of the P+ type region. Accordingly, the L-DMOSFET may be used as a protection element in connection with the withstand voltage of the element.

DESCRIPTION OF THE PREFERRED EMBODIMENTS

An L-DMOSFET constructed according to the present invention will be described with reference to the accompanying drawings.

Figure 1:
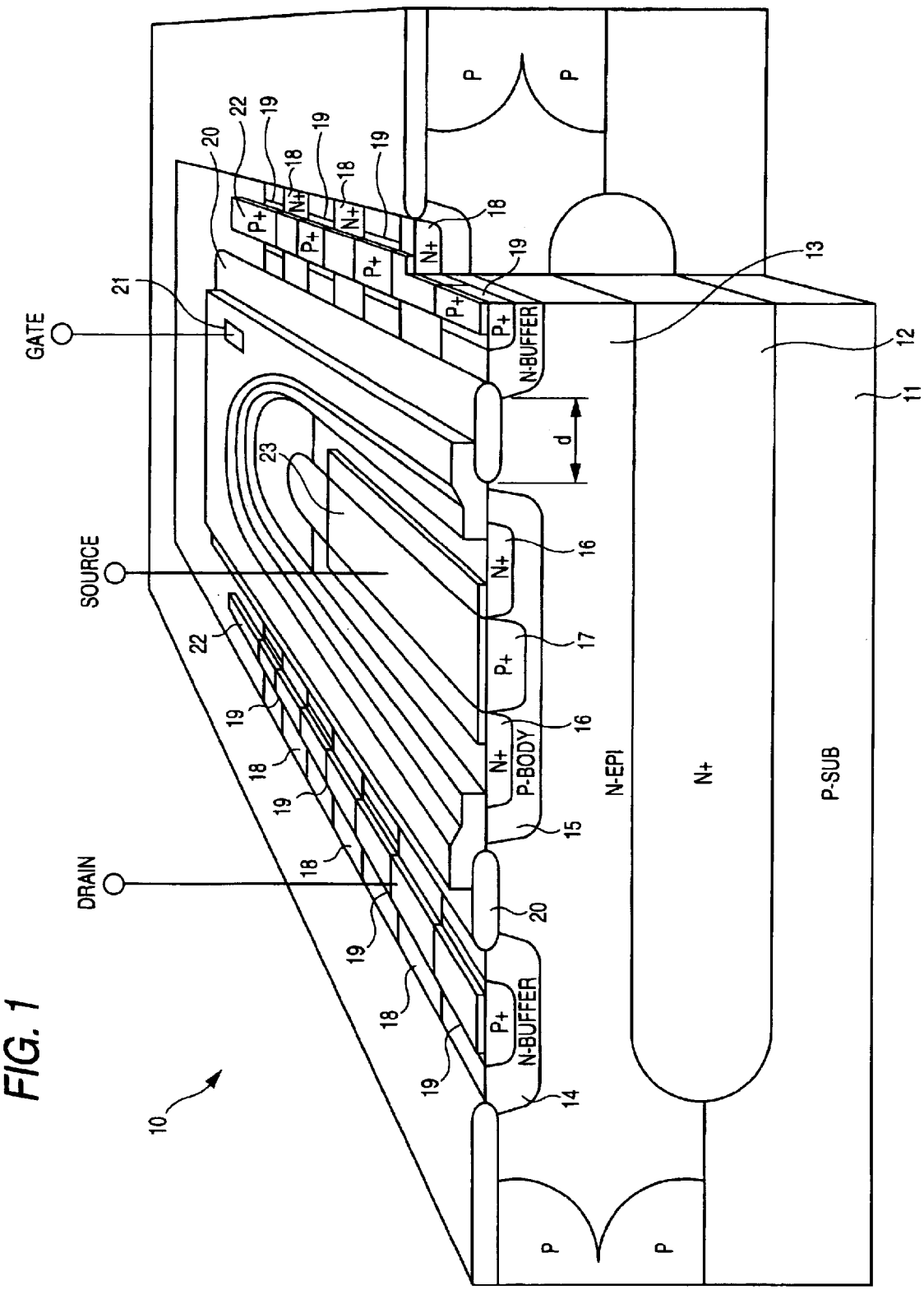
FIG. 1 is a cross sectional view perspectively showing a double diffusion MOSFET which is an embodiment of the invention.

FIG. 1 is a cross sectional view perspectively showing a double diffusion MOSFET which is an embodiment of the invention. A drain region 13 is formed in a manner that an N-type semiconductor layer is epitaxially grown on a P-type semiconductor substrate 11 with an N+ type buried region 12 being interposed therebetween. An N buffer layer 14 is formed by diffusing an N-type impurity into the drain region 13. A body region 15 is formed by diffusing a P-type impurity into the same.

An $N^+$-type source region 16 is formed in a surface region of the body region 15, while being spaced apart from an outer edge of the body region 15. A P+-type region 17 is formed on the inner side of the N+-type source region 16. Within the N buffer layer 14, N+ type drain contact regions 18 and P+ type regions 19, while being in contact with one another are alternately arrayed along the N+ type source region 16. A drift channel region 20 is formed between the N+ type source region 16 and the N buffer layer 14.

A gate electrode is provided covering a surface region ranging from an outer edge part of the N+-type source region 16 to the inner edge part of the drift channel region 20, while a gate oxide film is interposed therebetween. A drain electrode 22 so formed as to come in contact with an N+ type drain contact region 18 is formed so that a potential of the N+ type drain contact region 18 is equal to that of the P+ type region 19. A source electrode 23 is formed extending to both the N+ type source region 16 and the P+ type region 17.

The N+ type drain contact region 18 is cut out at plural locations, equidistantly spaced, along the N-type source region. The P+ type region 19 is provided at each of those cutout parts. Each P+ type region 19 is disposed such that an end of the P+ type region closer to the body region 15 is set back from an end of the N+ type drain contact region 18 closer to the body region 15 by a distance of 1.0 μm, for example.

As described above, the N+ type drain contact regions 18 and the P+ type regions 19, while being in contact with one another, are formed in the drain region 13, whereby a PNP transistor is parasitic to the L-DMOSFET 10. This parasitic PNP transistor and the originally present NPN transistor cooperatively form a parasitic thyristor.

Accordingly, in the L-DMOSFET 10, there is no need for reducing the gain of the parasitic NPN transistor, and hence the L-DMOSFET is free from the problem of degrading its original characteristic. Further, there is no need of providing the protection circuit or the like for the improvement of the breakdown resistance quantity. Accordingly, a high dielectric breakdown resistance quantity is obtained without increasing the element area.

The P+ type region 19 is laid out such that it is set back further from the body region 15 than the N+ type drain contact region 18 to thereby increase a withstand capability for a punch-through breakdown which occurs when a depletion layer extending between the source and the drain reaches the lateral double diffusion MOSFET 10 located closer to the drain.

Since a structure that the N+ type drain contact regions 18 and the P+ type regions 19 are covered with the N buffer layer 14 is employed, a depletion layer extending toward the drain is gradually held back. The withstand capability of the P+ type region 19 for the punch-through breakdown is further improved. The N+ type drain contact region 18 located closer to the drain is cut out at spatial intervals to have a comb-like structure. As a result, its conduction capability is lowered. However, such a structure that the N+ type drain contact regions 18 are covered with the N+ buffer layer 14 completely compensates for the lowering of the conduction capability.

Figure 2:
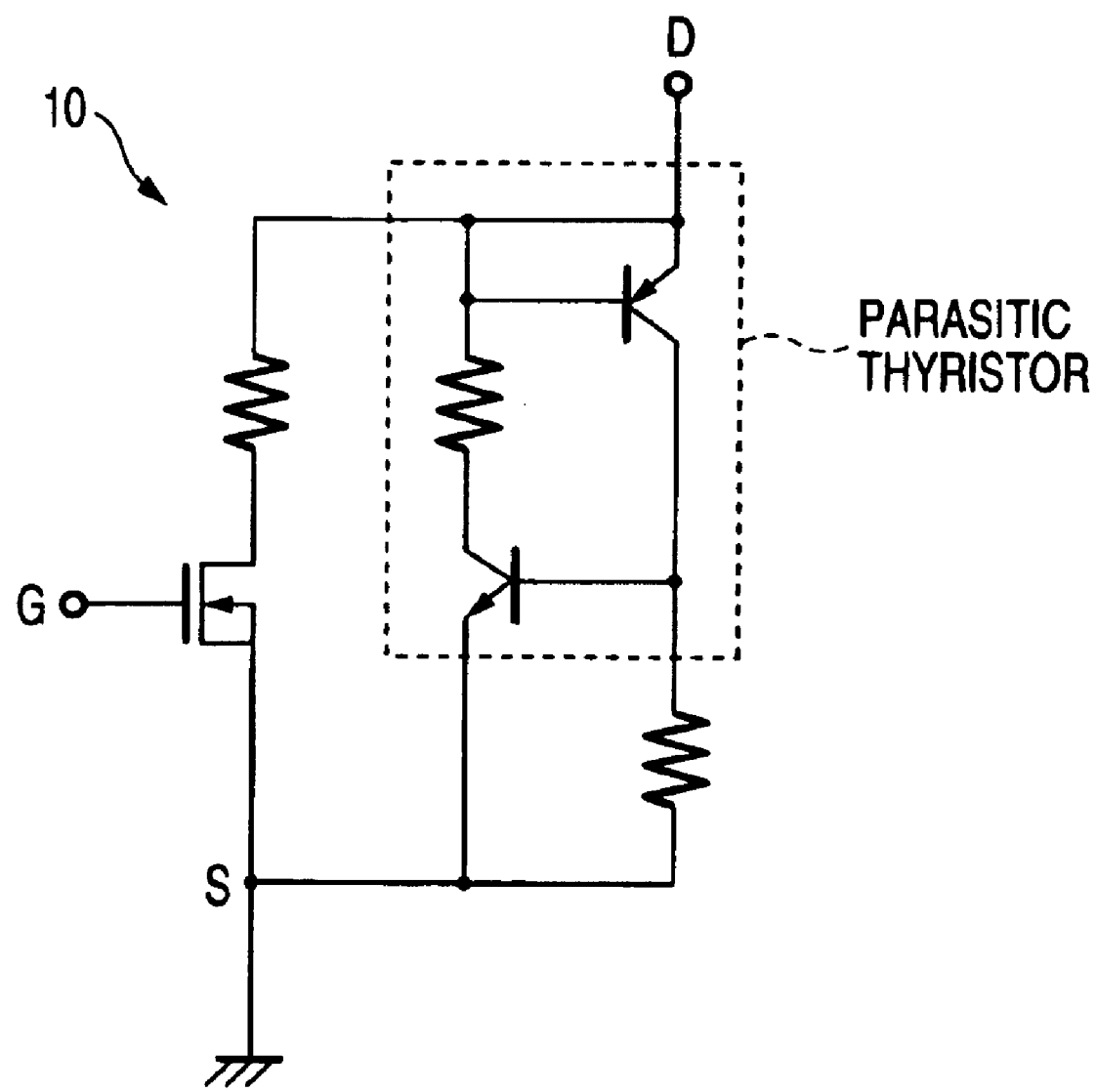
FIG. 2 is an equivalent circuit of the double diffusion MOSFET 10 shown in FIG. 1.

An equivalent circuit of this L-DMOSFET is shown in FIG. 2. As shown, the emitter and the base of the PNP transistor forming the parasitic thyristor of the L-DMOSFET are shortcircuited. Accordingly, normally the FET does not operate. Accordingly, the L MOSFET L-DMOSFET 10, when turned on, operates like the conventional L-DMOSFET. Even in a large current region, no care must be taken to the presence of the parasitic thyristor. For the same reason, the L-DMOSFET is free from the Vf loss at its start time which essentially occurs in the IGBT, and secures a low on-resistance even in a low current region.

With a structure that the drain electrode 22 is extended to the surface of the N buffer layer 14, the P+ type regions 19 and the drain region 13 are put at an equal potential. Accordingly, injection of positive holes from the P+ type region 19 does not occur, while it occurs in the IGBT. Accordingly, a switching speed (frequency characteristic) of the L-DMOSFET 10 is comparable with that of the conventional L-DMOSFET.

If once a static electricity is applied to the L-DMOSFET, the PNP transistor is forcibly broken down by its high voltage, and the parasitic thyristor starts to operate. Accordingly, it can process considerably large current at considerably low on-resistance, so that the Electro-static discharge performance (ESD) is remarkably improved.

The L-DMOSFET 10 of the embodiment succeeds in increasing the Electro-static discharge performance (ESD) to be 3 to 10 times as large as that of the conventional L-DMOSFET, by not using any new fabricating technique and without damaging the characteristic of the conventional L-DMOSFET. The Electro-static discharge performance (ESD) of the conventional L-DMOSFET is about 1.5 kV when measured by using a human body as a model. The Electro-static discharge performance (ESD) of the L-DMOSFET of the invention was 4.5 kV to 15 kV, i.e., 3 to 10 times as large as that of the conventional L-DMOSFET.

Figure 3:
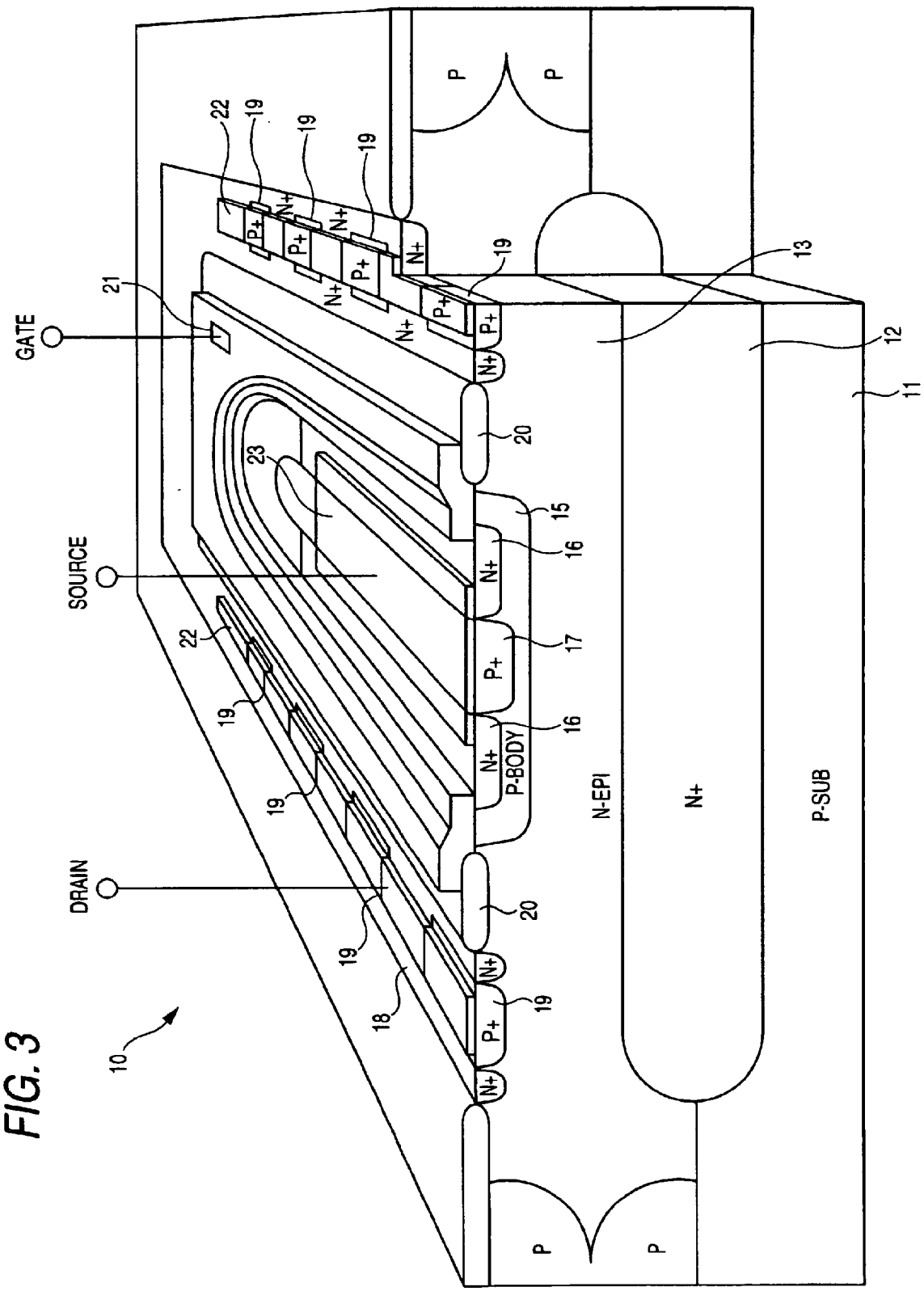
FIG. 3 is a cross sectional view perspectively showing a double diffusion MOSFET which is another embodiment of the invention.

FIG. 3 is a cross sectional view perspectively showing an L-DMOSFET which is another embodiment of the invention. The instant embodiment employs a structure where the N+ type drain contact region 18 is bored at positions that are equidistantly spaced, instead of the structure where the N+ type drain contact region 18 located closer to the drain is cut out at positions that are spaced at spatial intervals. The P+ type regions 19 are buried in those bored parts, respectively, whereby the P+ type regions 19 are formed in an area surrounded by the N+ type drain contact region 18. The L-DMOSFET having a structure of FIG. 3 produces advantages comparable with those of the L-DMOSFET of the FIG. 1 embodiment.

Figure 4:
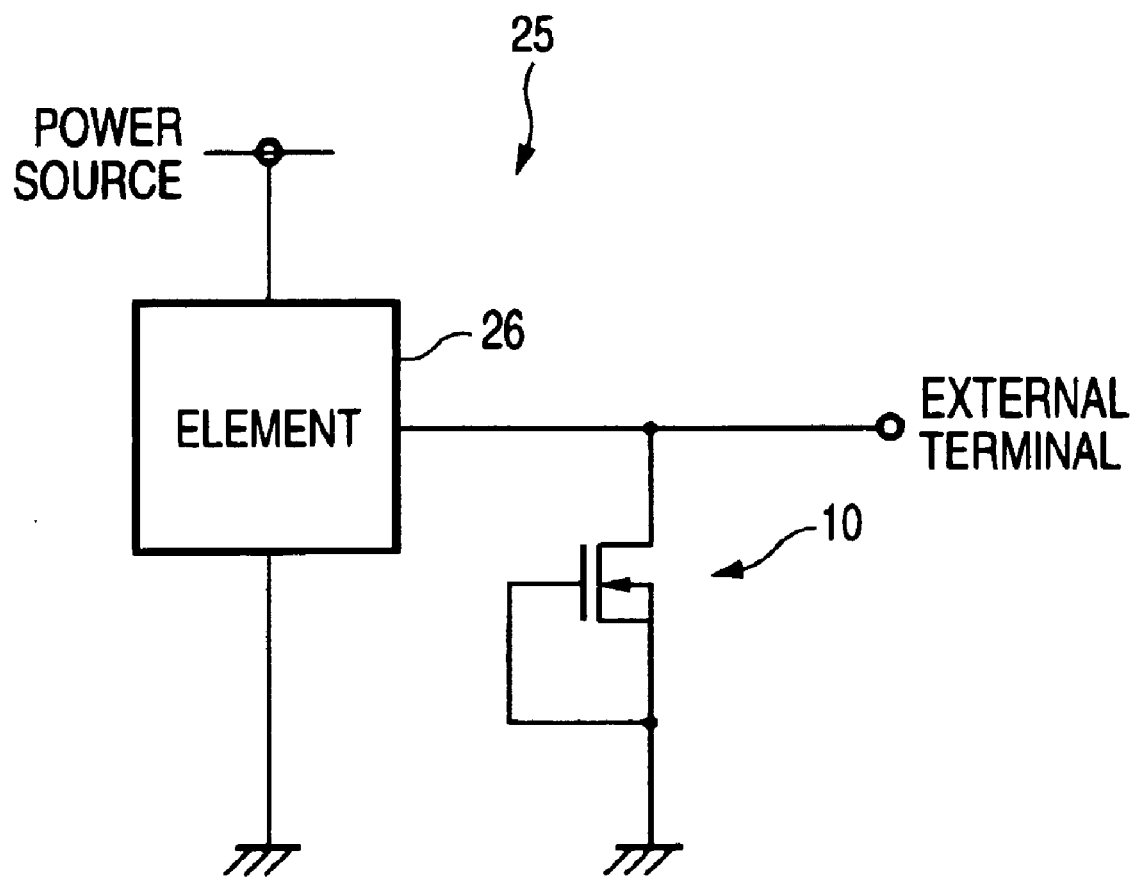
FIG. 4 is a circuit diagram showing an electrical arrangement of a semiconductor device according to the invention.
Figure 5:
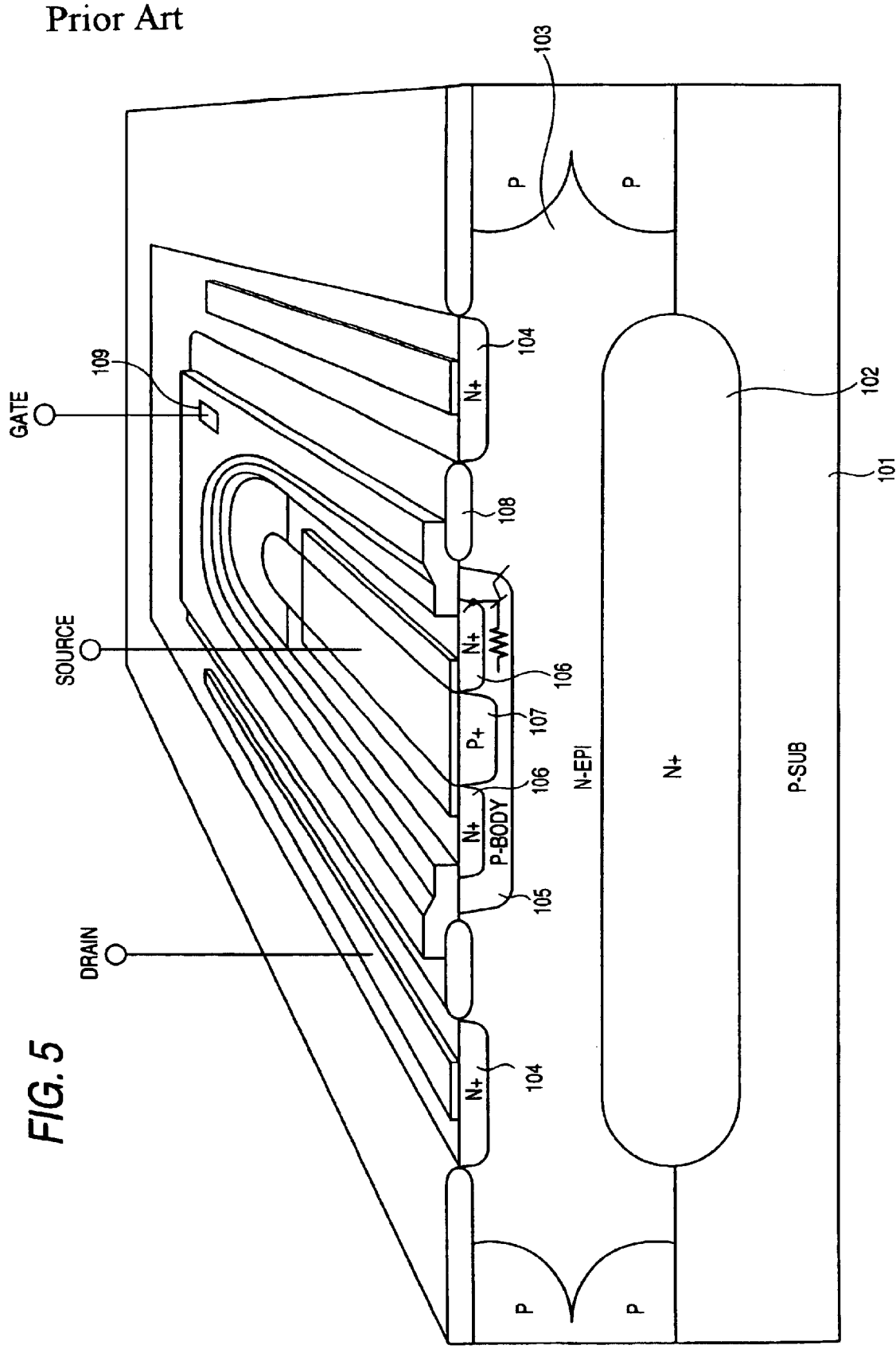
FIG. 5 is a cross sectional view perspectively showing a conventional double diffusion MOSFET.
Figure 6:
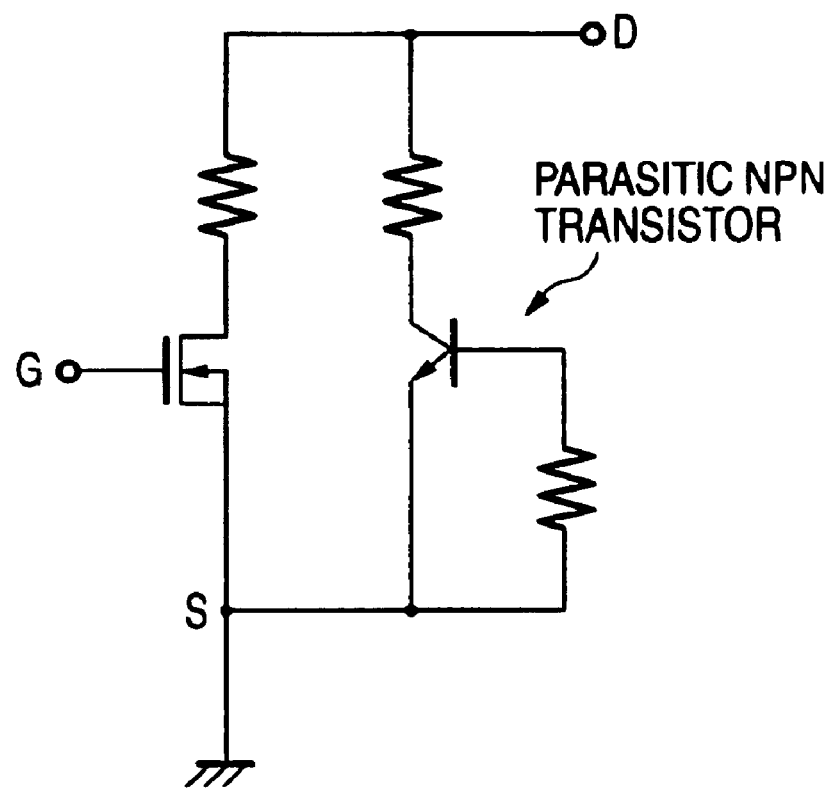
FIG. 6 is an equivalent circuit of the conventional double diffusion MOSFET 10 shown in FIG. 5.
Figure 7:
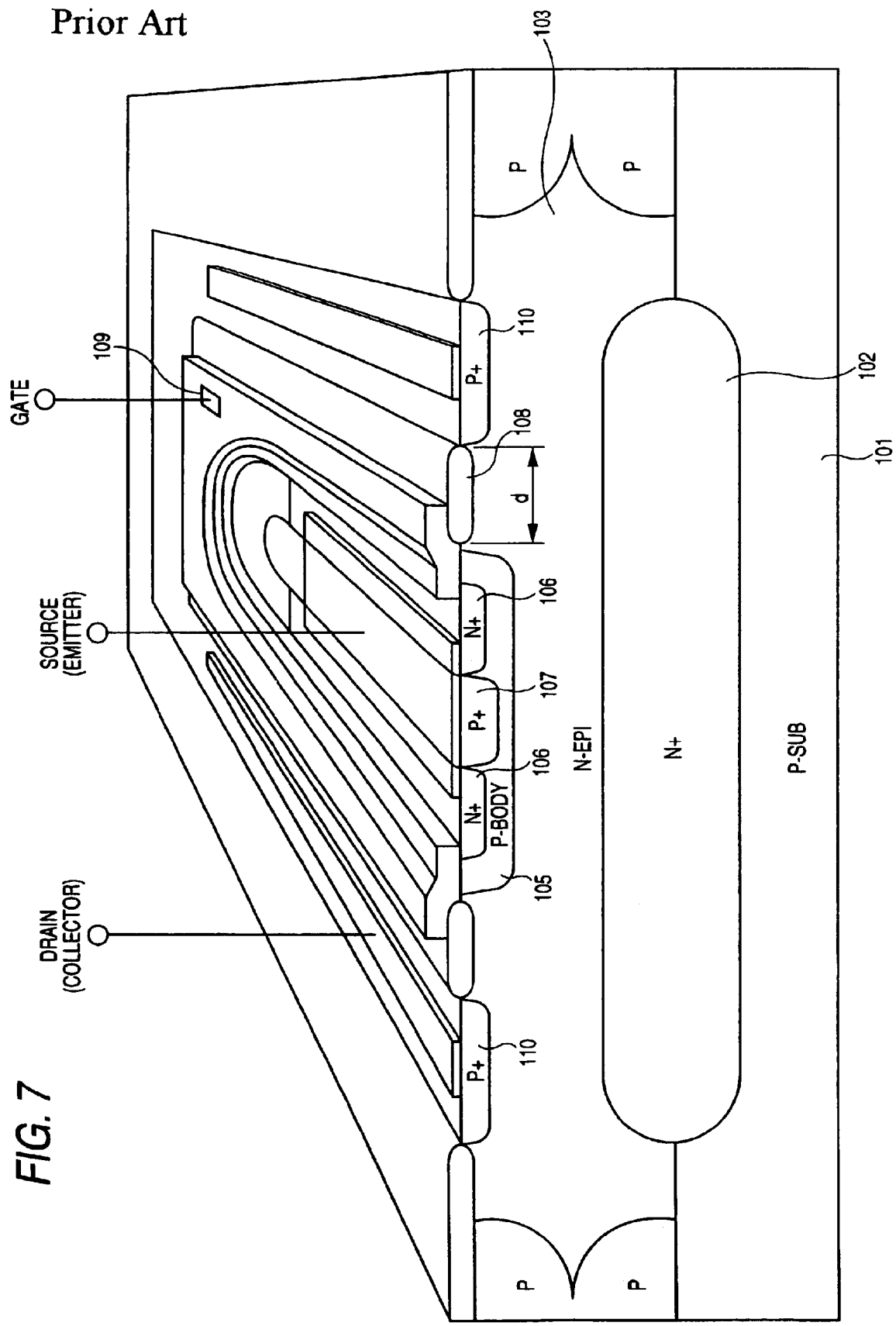
FIG. 7 is a cross sectional view perspectively showing an insulated gate bipolar transistor.
Figure 8:
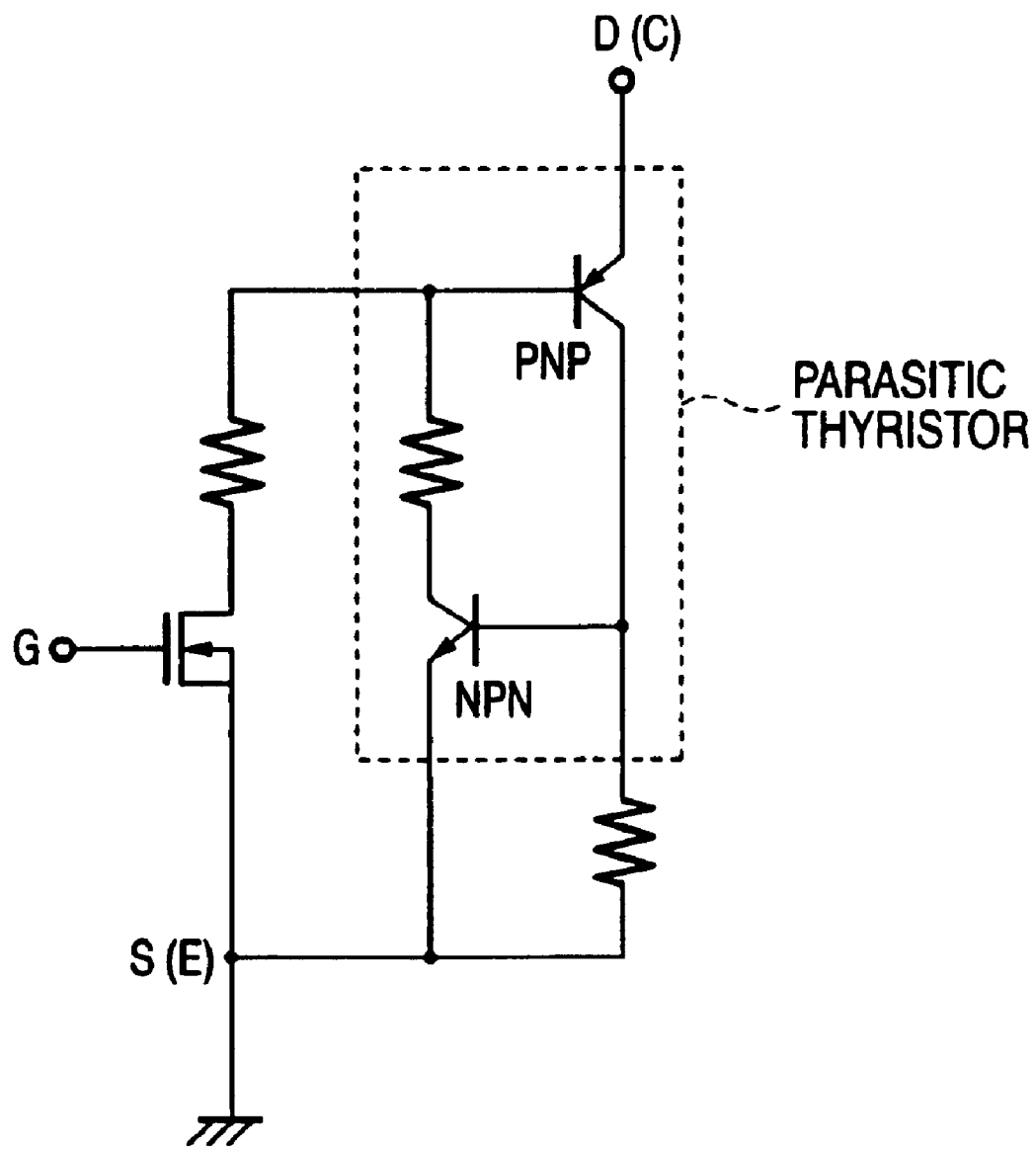
FIG. 8 is an equivalent circuit of the insulated gate bipolar transistor shown in FIG. 7.

FIG. 4 is a circuit diagram showing an electrical arrangement of a semiconductor device according to the invention. This semiconductor device 25 is manufactured by integrating L-DMOSFET 10 thus structured together with another element 26.

In the thus arranged semiconductor device, the breakdown withstand voltage of the L-DMOSFET 10 may easily be adjusted by varying the drift length "d" of the L-DMOSFET 10 to be integrated together with the element 26 and the setback length of the P+ type region 19. Accordingly, the L-DMOSFET 10 may be used as a protection element in connection with the withstand voltage of the element 26.

As seen from the foregoing description, in a double diffusion MOSFET of the invention, the N+ type drain contact regions and P+ type regions are formed in the drain region such that those regions are put at an equal potential. Accordingly, the MOSFET is attendant with a parasitic thyristor. There is no need of lowering a gain of the parasitic NPN transistor, and hence there is no chance of degrading the characteristics of the L-DMOSFET. Further, there is no need to use a protection circuit to improve the breakdown resistance quantity, and hence, a high dielectric breakdown resistance quantity is secured without increasing the element area.

Also in the semiconductor device of the invention, a high Electro-static discharge performance (ESD) is secured when a lateral double diffusion MOFSET is used as a protection element for an internal circuit (or internal element).

What is claimed is:

1. A double diffusion MOSFET comprising:
   a drain region of an N-type semiconductor layer formed on a semiconductor substrate;
   a body region of a P-type semiconductor region formed in said drain region;
   an N-type source region formed in said body region; and
   a gate electrode formed on a surface of said body region with a gate insulating film being interposed therebetween;
   wherein said drain region contains N+ type drain contact regions formed on a surface of said drain region and P+ type regions electrically connected to said N+ type drain contact regions so that said N+ type drain contact regions and said P+ type regions are put at an equal potential,
   said N+ type drain contact regions are shaped like a comb, the N+ type drain contact regions defining comb-like projections and said P+ type regions being placed in gaps formed between the adjacent projections thereof, and
   an end of said P+ type region closer to said body region is set back further from said body region than an end of said N+ type drain contact region closer to said body region.

2. A double diffusion MOSFET according to claim 1, wherein a drain electrode is formed so as to come in contact with said N+ type drain contact regions and extending to a surface of each of said P+ type regions.

3. A double diffusion MOSFET according to claim 1, wherein the projections are located on the gate side.

4. A double diffusion MOSFET according to claim 1, wherein said P+ type regions are formed in an area surrounded by said N+ type drain contact regions.

5. A double diffusion MOSFET according to claim 1, wherein said P+ type regions and said N+ type drain contact regions are formed in an N buffer layer formed in said drain region.

6. A semiconductor device comprising:
   a semiconductor substrate;
   a drain region of an N-type semiconductor region formed on a surface of said semiconductor substrate;
   a body region of a P-type semiconductor region formed in said drain region;
   an N-type source region formed in said body region;
   a gate electrode formed on a surface of said body region with a gate insulating film being interposed therebetween,
   N+ type drain contact regions formed on a surface of said drain region and P+ type regions electrically connected to said N+ type drain contact regions so that said N+ type drain contact regions and said P+ type regions are put at an equal potential, said N+ type drain contact regions and said P+ type regions being located within said drain region;
   a drain electrode extending from said N+ type drain contact regions to a surface of each of said P+ type regions; and
   a source electrode formed so as to come in contact with said N-type source region,
   wherein said P+ type regions and said N+ type drain contact regions are formed in an N buffer layer formed in said drain region.

7. A double diffusion MOSFET comprising:
   a drain region of an N-type semiconductor layer formed on a semiconductor substrate;
   a body region of a P-type semiconductor region formed in said drain region;
   an N-type source region formed in said body region; and
   a gate electrode formed on a surface of said body region with a gate insulating film being interposed therebetween,
   wherein said drain region contains N+ type drain contact regions formed on a surface of said drain region and P+ type regions electrically connected to said N+ type drain contact regions so that said N+ type drain contact regions and said P+ type regions are put at an equal potential, and
   wherein said P+ type regions and said N+ type drain contact regions are formed in an N buffer layer formed in said drain region.

8. A double diffusion MOSFET according to claim 7, wherein a drain electrode is formed so as to come in contact with said N+ type drain contact regions and extending to a surface of said P+ type regions.

9. A double diffusion MOSFET according to claim 7, wherein an end of said P+ type region closer to said body region is set back further from said body region than an end of said N+ type drain contact region closer to said body region.

10. A double diffusion MOSFET according to claim 7, wherein said P+ type regions are formed in an area surrounded by said N+ type drain contact regions.

* * * * *